United States Patent [19]

Semple

[11] Patent Number: 5,271,455

[45] Date of Patent: Dec. 21, 1993

[54] TEMPERATURE LIMITING APPARATUS FOR ELEVATOR CONTROLS

[75] Inventor: J. Brooks Semple, Warrenton, Va.

[73] Assignee: Smoke/Fire Risk Management, Inc., Warrenton, Va.

[21] Appl. No.: 720,414

[22] Filed: Jun. 25, 1991

[51] Int. Cl.⁵ .................... H02B 1/00; B66B 1/00
[52] U.S. Cl. .................... 165/80.4; 62/259.2; 187/100; 361/699; 361/707
[58] Field of Search .................... 62/259.2, 435; 165/80.4, 80.5; 362/96; 361/382, 385 X, 388 X; 174/15.1; 357/82; 187/100

[56] References Cited

U.S. PATENT DOCUMENTS

| | | | |
|---|---|---|---|
| 2,901,893 | 9/1959 | Saltzman | 361/385 X |
| 3,253,646 | 5/1966 | Koltuniak et al. | 361/382 |
| 3,481,393 | 12/1969 | Chu | 165/80.4 |
| 3,490,517 | 1/1970 | Meckler | 62/435 X |
| 4,009,423 | 2/1977 | Wilson | 361/385 |
| 4,072,188 | 2/1978 | Wilson et al. | 361/385 X |
| 4,280,335 | 7/1981 | Perez et al. | 62/435 X |
| 4,616,694 | 10/1986 | Hsieh | 361/385 X |
| 4,646,202 | 2/1987 | Hook et al. | 165/80.4 X |
| 4,721,996 | 1/1988 | Tustaniwskyj | 361/385 X |
| 4,793,405 | 12/1988 | Diggelmann et al. | 165/80.4 X |
| 5,057,968 | 10/1991 | Morrison | 361/385 |

*Primary Examiner*—William E. Wayner
*Attorney, Agent, or Firm*—Eckert Seamans Cherin & Mellott

[57] ABSTRACT

A temperature regulated control arrangement for an elevator controller includes a mounting panel and at least one semiconductor electrical device attached to the mounting panel. The panel is at least partly thermally conductive and is mounted on a housing which defines at least partly a fluid passageway. Couplings connect liquid conduits to the passageway, and the conduits communicate a liquid to and from the passageway. The volume of liquid in the passageway is sufficient to absorb enough heat to keep the semiconductor devices within their operating temperature limits for a period of time even after failure of the liquid circulating system.

13 Claims, 3 Drawing Sheets

TEMPERATURE LIMITING APPARATUS FOR ELEVATOR CONTROLS

BACKGROUND OF THE INVENTION

1. Field of the Invention

The invention relates to the field of electrical controls and enclosures having means for maintaining electrical components within an operating range of temperature. More particularly, the invention concerns elevator electrical controls thermally coupled to a circulating heat transfer system for permitting operation of the elevator for a period of time during a fire in a building.

2. Prior Art:

All modern high rise buildings have elevators for transporting people and equipment between the various floors in the building. Even buildings having only a few floors may have elevators to permit easier access to upper floors, especially for handicapped and elderly people. Federal legislation regarding building access mandate the use of elevators. However, it is unsafe to use conventional elevators to evacuate multiple story buildings during fires and other emergencies when speedy evacuation is most critical.

There are several aspects of fires that can render elevator transport unsafe, including problems with rapid smoke development and circulation, heat and structural damage, any of which can trap elevator occupants under life threatening conditions. Unless precautions are taken as to these aspects, the elevators may cease to function during fires and other emergencies, and occupants of the building, especially those trapped in the elevators, can suffer injury or death.

It is known to construct buildings having separate ventilation systems coupled to the elevator shafts and elevator lobbies, the shafts and lobbies being constructed of fire resistant materials and being pressurized slightly above ambient pressure to prevent inflow of smoke. In this manner people entering or emerging from an elevator during a building fire are not confronted by smoke and flame from the fire. Buildings can be provided with emergency backup electrical generators to provide power for operating the elevators during an emergency.

All elevator systems have electric drive motors and control systems coupled between the motors and the elevator cars, for raising and lowering the cars and opening and closing the car doors. Typically a central control device such as a microcomputer senses switch inputs from the cars and from call buttons in the elevator lobbies and the like, and provides control outputs to motor starter relays or other high current switches (e.g., SCRs, triacs or the like). The central control device is typically located in an elevator machine room above the elevator shafts where the electric drive motors are located.

Modern elevator controls including the central control and motor starter switches generally include solid state components, the operation of which is in general temperature dependent. Semiconductor devices such as integrated circuits, transistors, SCRs, triacs and the like are susceptible to malfunction due to heat. Thermal runaway conduction can occur if such devices are operated above their rated temperatures, potentially causing permanent damage due to overheating or damage to the controlled equipment due to generation of inappropriate control outputs. Under elevated temperature conditions (for example over 104° Fahrenheit) the critical logic and timing functions of a microprocessor are subject to malfunction. Temperatures in the range of possible problems are easily generated by fire conditions, and also can be generated by simple weather conditions, for example if the HVAC system in the building breaks down on a hot day. The prior art methods of ensuring continued elevator operation for evacuation or fire fighter access during a fire do not provide for maintaining critical elevator controls at a safe operating temperature. Whereas elevator machine rooms where the controls are normally located are particularly susceptible to fires (e.g., due to the concentration of equipment and materials there), the most extensive use of ventilation and elevator shaft sealing steps may fail as a practical matter due to a heat-induced failure of the solid state controls which sense switch inputs and operate the elevator motors and doors. Thus, there is a need for providing an elevator control apparatus which maintains critical solid state components at a safe operating temperature even during a fire in the immediate area, at least for a period of time sufficient to evacuate all people from the building before other occurrences such as shorting of burned wires or falling debris render even properly controlled elevators inoperative.

Systems for cooling electrical devices and control cabinets are known per se. The cabinets housing temperature sensitive devices frequently include forced air circulation means and the components which dissipate heat or are sensitive to heat can be provided with heat sinks in thermal engagement with the components. The heat sinks provide added surface area for air contact or may be thermally coupled to a common heat exchange body and cooled by a fan blowing ambient air over the heat sinks, common surface and/or electrical components. Such fan cooling cannot possibly maintain a temperature lower than ambient air temperature. During a fire, the ambient air temperature rises quickly above the operating temperature range of the electrical components. Additional or alternate means for protecting the solid state devices during a fire are needed.

Liquid immersion cooling of electrical components is known in connection with aircraft and missile control applications. Immersion cooling is complex and expensive because the electrical components must be sealed against the liquid. A simple and inexpensive method of cooling elevator control panels is needed, which takes appropriate advantage of the aspects of a building and its elevator operating system.

It is also known to include refrigeration equipment in electrical control cabinets, particularly large capacity computers. An electric heat pump air conditioner cools air blown into the cabinet or air recirculated within the cabinet. Refrigeration equipment is relatively large, expensive, and subject to maintenance requirements, which require too large an investment of money and time to be justified for cooling elevator controls against the relatively remote possibility of a fire. Refrigeration equipment releases heat into the area outside the cabinet. It is susceptible to its own malfunction due to external heat, and generally is not suitable as a safety cooling means for the control apparatus of an elevator system, for reasons of both cost and effectiveness.

A device is needed which maintains temperature conditions for a control device for an elevator, is suitable for use in an elevator machine room, and provides sufficient cooling during a fire to permit the elevator to operate at least for a period of time sufficient to evacuate occupants of the building.

SUMMARY OF THE INVENTION

It is an object of the invention to provide an electrical control apparatus having means for temperature regulation sufficient to withstand the heat of a nearby fire for a predetermined time in which building occupants can be evacuated.

It is a further object of the invention to provide an electrical control apparatus which is cooled by a thermal transfer fluid such as circulating water, without the need for immersion of electrical components in the thermal transfer fluid.

It is still another object of the invention to provide a control for an elevator which does not depend on a cooling fan and allows the cabinet for the control to be isolated from air outside the cabinet.

It is yet another object of the invention to provide a temperature regulated control which is simple, effective and inexpensive.

These and other objects are accomplished by a control apparatus for an elevator system, including a thermally conductive, fluid impervious mounting panel and at least one semiconductor control device attached in thermal communication with the mounting panel. A heat sink of the control device can be in contact with a dry-side surface of the mounting panel and an opposite wet side at least partly defines a passageway for a heat transfer liquid such as water. Alternatively the heat sink can protrude through the mounting panel in a sealed manner to contact the heat transfer liquid. Conduit means are provided for communicating the liquid through the passageway, and coupling means are provided for connecting the conduit means to the passageway. Preferably, the liquid is normally routed through the passageway. The liquid, for example, may be water from a circulating chilled water system within a building. The liquid may also simply be a branch of the domestic water supply. The volume of liquid within the passageway under a no flow condition (worst case) is a sufficient static heat sink to maintain a temperature of the control panel within nominal temperature limits of operating semiconductor devices of the control apparatus for a sufficient time to evacuate the building, e.g., at least one hour, during maximum electrical load on the control apparatus as characteristic of heavy elevator use during evacuation.

The invention should be applied to all the elevators in a building, but may be applied to a subset of fire evacuation elevators. Preferably, the invention is used in conjunction with a separate ventilation supply and thermal insulation arrangement for the elevators being controlled.

BRIEF DESCRIPTION OF THE DRAWINGS

There are shown in the drawings the embodiments of the invention that are presently preferred. It should be understood, however, that the invention is not limited to the precise arrangements and instrumentalities shown in the drawings, wherein.

DETAILED DESCRIPTION OF THE PREFERRED EMBODIMENTS

Figure 1:
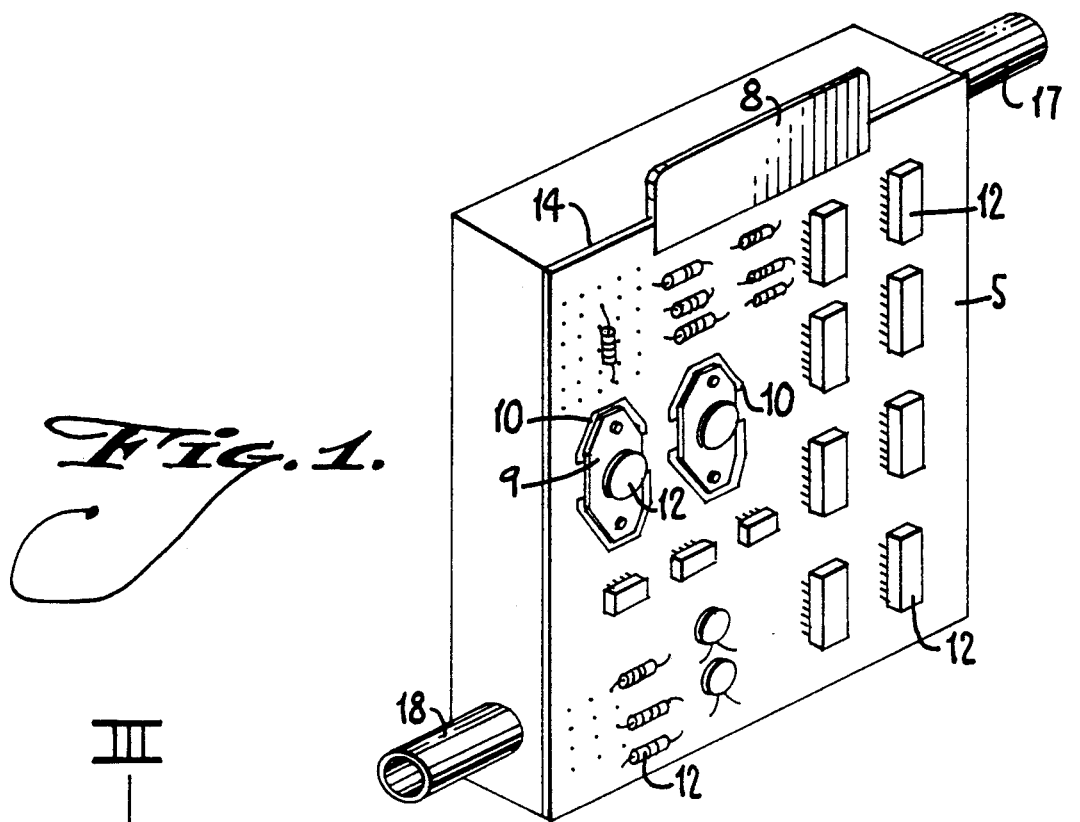
FIG. 1 is a front perspective view of a temperature regulated control apparatus according to the invention.
Figure 2:
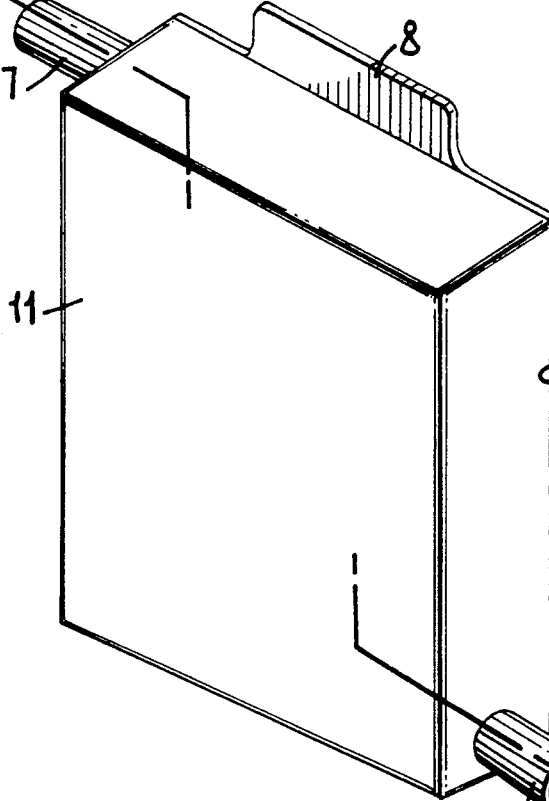
FIG. 2 is a rear perspective view thereof.

A temperature limiting control panel for elevator control systems as shown in FIGS. 1 and 2 comprises a mounting panel 5 arranged to be cooled by a liquid heat transfer medium, and at least one electrical device 12 attached to the mounting panel. The electrical device dissipates heat in operation and/or is subject to deterioration of operation at high temperatures, being for example a transistor, integrated circuit, diode, thyristor or like component of the control circuitry, subject to thermal current runaway. The mounting panel 5 can be a standard control circuit board for mounting solid state devices, with thermally conductive paths defined between the substrates of the electrical components and the rear or wet side of the mounting panel, which is thermally coupled to heat transfer medium. The mounting panel 5, for example, can be an essentially rigid, liquid-impervious and electrically non-conductive hard plastic, preferably one with good thermal conductivity. Alternatively phenolic resin or other conventional printed circuit board material can be used. The mounting panel is either inherently thermally conductive or includes thermally conductive (e.g., metal) portions 10 which extend through the mounting panel and provide the heat transfer path. Preferably, thermally conductive electrical insulation material such as sheets of mica isolate components 12 electrically from portions 10. The at least one electrical device 12 is attached by known methods, typically by soldering, such that the substrate of device 12 is in thermal communication with the rear or wet side of panel 5.

Figure 5:
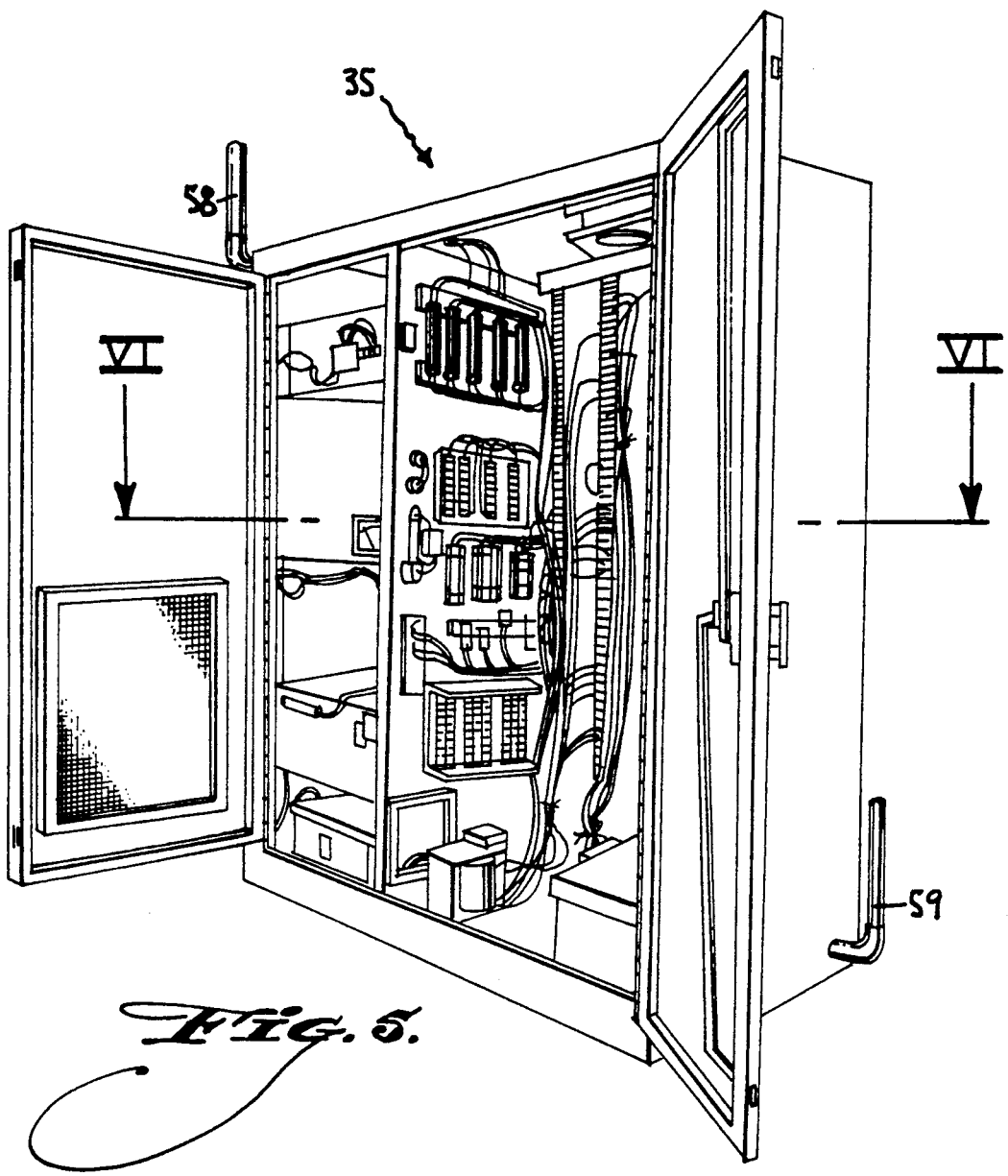
FIG. 5 is a perspective view of an alternative embodiment of the temperature regulated elevator control panel according to the invention.

In a detailed embodiment as shown in FIG. 5, the logic control elements of an elevator system are mounted in the same cabinet or junction box 25 as the high current motor starters or relays which are coupled to the control outputs from the logic control elements. Both the logic elements and the high current elements dissipate heat, and accordingly, operation of the elevators under heavy loading conditions tends to heat up the entire control system. In this embodiment, the logic control elements and the high current elements are conventionally mounted in the cabinet 25. However, at least one of the panels of cabinet 25 is a hollow structure forming a thermal reservoir or sink, which is coupled to a circulating system for conveying the liquid heat transfer medium through the panel, maintaining a regulated temperature on the panel surface, and throughout cabinet 25. Preferably, at least some of the thermally sensitive or heat dissipating components are mounted on the cooled panel, i.e., on one of the sidewalls, rear, top or bottom panels, or internal dividing panels. The components can be disposed in their own housings or cabinets within the enclosure, these housings or cabinets being arranged in thermal transfer contact with the cooled panel or panels.

The respective walls, top and bottom panels of cabinet 25 are typically formed from sheet metal, as are the housings of the components disposed in cabinet 25.

Accordingly, thermal transfer coupling can be obtained for example by clamping or bolting the housings to the cooled mounting panel. Insofar as components or subassemblies are maintained at other than ground potential during operation (for example the metal casings of power transistors, which are coupled to the collectors of the transistors), an electrically insulating layer having good thermal conductivity is interposed between each such electrical device and the mounting panel.

Figure 6:
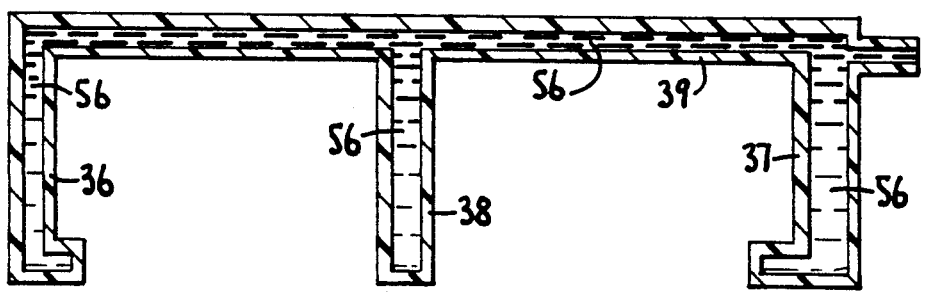
FIG. 6 is a cross-sectional view taken along line VI—VI of FIG. 5.

As shown in cross-section in FIG. 6, the cabinet 25 has end walls 36, 37, an interior dividing wall 38 and rear wall 39. Each of these walls can be hollow, defining interconnected passageways 56 for a liquid. Coupling means 58, 59, as shown in FIG. 5, are provided for connecting a liquid conduit to the interconnected passageways.

Figure 3:
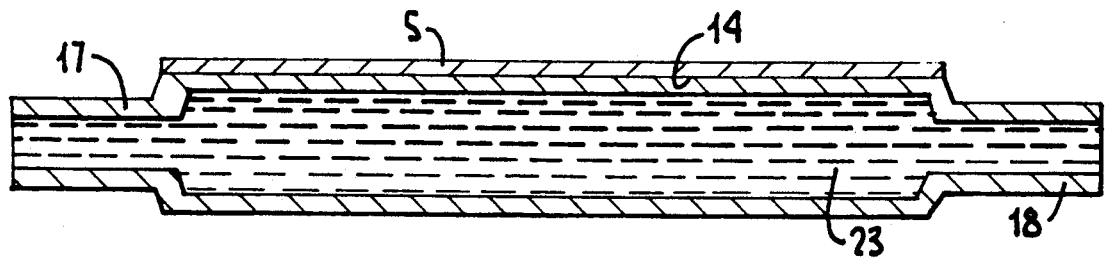
FIG. 3 is a top cross-sectional view taken along line III—III of FIG. 2.

Referring again to FIGS. 1 and 2, wherein the thermal reservoir is more directly associated with a single circuit board, the mounting panel 5 can be electrically coupled to other devices via connector 8. In addition to digital processors coupled to the control outputs, switching apparatus such as motor starters can be included in the temperature regulated control and operably coupled to the control outputs. Components which dissipate substantial heat, for example power transistors, thyristors (SCRs, triacs, etc.), are coupled to heat sink 9. The heat sink 9 is in contact with the mounting panel 5, or at least an area 10 of the panel which extends to a rear surface 14 of the mounting panel 5 for thermal conduction through the panel. Thermally conductive area 10 can be as a thickened metal portion of panel 5. As shown in FIGS. 2 and 3, the rear surface 14 of panel 5, and especially the rear of area 10 which is in thermal contact with heat sink 9, partly defines a passageway 23 for a liquid. The passageway 23 may be defined by panel 5 together with exterior housing 11, or may be cast, drilled or otherwise formed in a thickened portion of the mounting panel. The passageway 23 may be a plurality of spaced apart orifices through the heat sink and/or area 9. For example, the passageway 23 can be defined by a tubular conduit having lateral fins which thermally engage heat sinks 9 of components 12.

Coupling means 17, 18 in each embodiment are provided for connecting a liquid conduit to the passageway such that liquid flows through. The coupling means 17, 18 may be fluid couplings or simply lengths of tube which are cast into the housing 11 or welded to the housing so as to transfer heat. The conduit means are attachable to the connecting means for communicating a liquid to and from the passageway 23. The conduit means may be, for example, lengths of pipe or hose having one end attached to the coupling means 17, 18 and an other end attached to supply and return connections of a liquid circulating system.

The liquid circulating system can advantageously be part of an air conditioning system which provides recirculating chilled water to heat exchangers in a building HVAC system, and preferably is arranged on the cold side rather than the return. The chilled water communicated by the conduit means to and from the passageway 23 need only be a branch carrying a small proportion of the building cooling tower output.

The liquid within the passageway 23 is in thermal contact with the heat sink 9 through portion 10 of panel 5. Heat generated by the electrical components is transferred through the mounting panel 5 where it is absorbed by the liquid.

The chilled water in passageway 23 may tend to produce condensation on the panel 5 and the electrical components on panel 5. Accordingly, and also to prevent direct fire damage, panel 5, housing 11 and connections 17, 18 are enclosed within an outer housing 20 in FIG. 4, or 25 in FIG. 5. This outer housing is sealed airtight relative to the outside, for example using seals or gaskets along abutting edges of the access openings and access doors or panels, to thereby prevent continuous condensation which could lead to short circuits or to an electrical shock danger. The inside of outer housing 20 remains cool and dry even in the event of a fire in the immediate vicinity, e.g., in the elevator control room 30.

Heat produced by a fire will raise the temperature of the ambient air surrounding the housing 20 and control panel 5. The solid state devices of the control panel would otherwise absorb heat from the ambient air whenever the air temperature is greater than the temperature of the devices. Even according to the invention, some heat from the fire will be transferred into external housing 20, panel 5, etc. The heat absorbed, however, is also transferred through the mounting board 5 and walls of internal housing 11 for absorption and removal by the liquid in the passageway 23.

The control panel according to the invention is particularly advantageous in conjunction with an elevator control apparatus. Many elevator control systems are housed in cabinets including a cooling fan which forces ambient air through the cabinet for cooling. In the event of a fire in the area of the control apparatus such an arrangement is absolutely counterproductive and can be eliminated by using the liquid cooled control panel of the invention. Subassemblies within the cabinet may have their own fans; however, circulation of air is limited to the air within the sealed cabinet. Moreover, air cooled electronic apparatus must have relatively large heat sinks to provide adequate thermal transfer surface area, whereas thermal conduction via a liquid heat transfer medium allows the same heat transfer capability using a much smaller surface area. The present invention allows component heat sinks and other thermal transfer surfaces to be downsized to approximately one-seventh or less of the surface area of known thermal transfer arrangements in devices of this type (assuming comparable fluid flow rate). As a result, the size of the control system can be reduced as a whole, compared to previous designs. The size reduction and elimination of the forced air cooling fan also reduce the cost of the control system.

The elimination of forced air cooling of the control cabinet interior permits sealing of the cabinets and doors so that the contents are isolated against the intrusion of hot air and smoke. The sealed cabinet can thus be fitted effectively with gaseous ($CO_2$ or Halon) fire protection systems in case of internal fires. This arrangement also can segregate individual elevator car control so that, for example, three out of four cars in a bank can continue to operate even in case of a cabinet fire directly in the elevator machine room. This arrangement also eliminates the need for larger, room-size gas systems and their potential threat of suffocation to people therein. Complete cabinet sealing also waterproofs the controls against water damage from fire sprinklers and firefighter hoses. The versatility thus afforded readily permits continued operation of 75% of an elevator bank when either or both a control cabinet and the elevator machine room itself are experiencing working fires.

During normal operation, water from the circulating water system in the building flows through passageway 23. In the event of a fire or other severe building emergency, the flow of water may cease. Standing water will remain, however, in the passageway. The standing water still has a substantial capacity to absorb heat. The passageway is preferably sized larger than the dimensions dictated by flow rate and pressure drop requirements so that it contains a sufficient volume of water to maintain a temperature of the control panel within operational limits of the semiconductor elements of the control system for a predetermined time, for example at least one hour, during maximum electrical load on the control panel.

Figure 4:
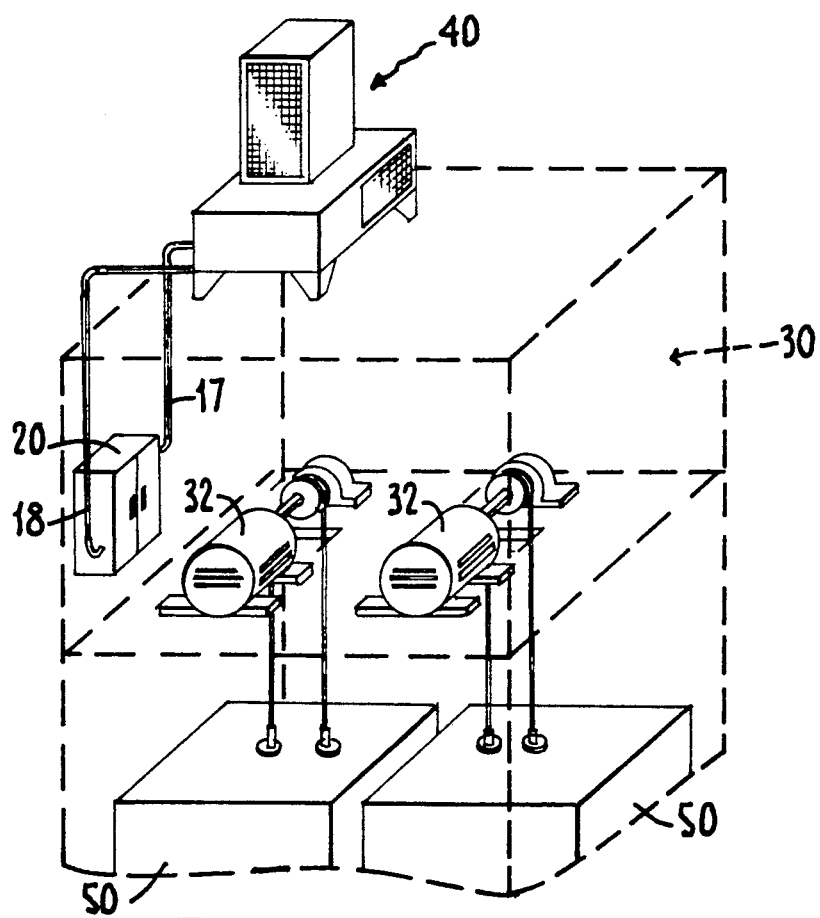
FIG. 4 is a perspective view of an exemplary means for connecting a circulating fluid heat transfer system to an elevator control apparatus according to the invention, the building, elevator shafts and elevator cars being shown schematically in broken lines.

FIG. 4 illustrates the invention as applied to a building 30. The control apparatus, disposed within outer housing 20, is located in the area of the elevator machine room 30. Typically, the elevator machine room is located immediately above the shafts carrying elevator cars 50, such that the elevator motors 32 are conveniently positioned to raise and lower the elevators. Similarly, cooling tower apparatus 40 is typically located on the roof. It will be appreciated that it is a simple matter to provide a branch flow path from the cooling tower, including conduits 17, 18 coupled to the supply and return lines of the building air conditioning system.

It is also possible to couple lines 17, 18 into the regular domestic water supply of the building. Whereas the average usage in a large building typically varies with the number of occupants present, and inasmuch as the usage of the elevators also varies with the number of occupants present, coupling the control apparatus cooling system through the domestic water supply will normally extract sufficient heat to keep the elevator controls below their upper operating temperature limits. As noted above, however, in the event of a fire or stoppage of the water flow, it is advisable to provide a sufficient volume of water to absorb heat dissipated by control apparatus for a time in the water or other thermal transfer fluid which is disposed at passageway 23, or immediately adjacent passageway 23.

The invention having been disclosed, variations and additional embodiments in accordance with the invention will now become apparent to persons skilled in the art. Reference should be made to the appended claims rather than the foregoing specification to assess the scope of the invention in which exclusive rights are claimed.

I claim:

1. Elevator control panel temperature limiting apparatus for use in a system having an elevator movable between floors in a building, the apparatus comprising:
   a control panel for enabling selective operation of the elevator, the control panel including a mounting panel having at least one semiconductor device attached thereto, the semiconductor device being operable dependably only below a predetermined maximum temperature;
   thermally conductive means in thermal communication with the semiconductor device, said thermally conductive means at least partly defining a passageway for a heat transfer liquid; and,
   conduit means connected to a liquid circulating system in the building for communicating a liquid between the liquid circulating system and the passageway, such that the liquid limits a temperature of the elevator control panel;
   wherein the liquid in the circulating system is sufficient to maintain a temperature of the control panel below a maximum operating temperature limit of the semiconductor device for a predetermined time following an increase in ambient temperature, enabling extended operation of the elevator after said increase in ambient temperature.

2. The temperature limiting apparatus according to claim 1, wherein the panel is fluid impervious and is mounted to a housing such that the panel defines a wall of the housing at least partly encompassing the passageway.

3. The temperature limiting apparatus according to claim 2, wherein the mounting panel is disposed in a cabinet having at least one hollow wall, and the passageway is defined by the at least one hollow wall of the cabinet.

4. The temperature limiting apparatus according to claim 2, wherein the passageway has a volume at the housing of sufficient volume to maintain a temperature of the control panel below a maximum operating temperature limit of the semiconductor device for a predetermined time absent flow of the liquid.

5. The temperature limiting apparatus according to claim 1, wherein the heat transfer liquid comprises water.

6. A water jacket thermally coupled to an elevator control cabinet containing semiconductor control elements for operating at least one elevator, the water jacket defining a heat sink operable to maintain a temperature of said semiconductor switching elements for an extended time following an increase in temperature and thereby extending a time of elevator control operation following the increase in ambient temperature; and wherein the water jacket forms at least part of a substantially airtight enclosure for the semiconductor switching elements and thermally couples to the control cabinet a quantity of liquid sufficient to maintain the semiconductor switching elements below said maximum temperature for said extended time under peak elevator usage.

7. The water jacket according to claim 6, wherein the quantity of liquid is sufficient to maintain the semiconductor switching elements below said maximum temperature for a minimum of one hour during peak elevator usage.

8. The water jacket according to claim 6, wherein the existing liquid is existing available water from a building supply.

9. The water jacket according to claim 6, further comprising sealed control cabinets to exclude all airborne contaminants from the elevator machine room and to provide a leak proof container for fire control gases such as carbon dioxide and Halon.

10. The water jacket according to claim 6, wherein existing liquid circulating in a building is coupled to the water jacket and used for cooling.

11. The water jacket according to claim 10, wherein a domestic water supply within a building is used for said cooling, flow in the domestic water supply varying as a function of usage of the domestic water supply by building occupants.

12. The water jacket according to claim 10, wherein the water jacket is coupled into a branch of at least one of a supply and a return from a cooling tower associated with a building.

13. The water jacket according to claim 10, wherein the water jacket thermally couples to the control cabinet a quantity of non-flowing liquid sufficient to maintain the semiconductor switching elements below said maximum temperature for a minimum of one hour during peak elevator usage, upon loss of flow of the existing liquid.

* * * * *